United States Patent
Sato et al.

(10) Patent No.: US 8,331,122 B2
(45) Date of Patent: Dec. 11, 2012

(54) SEMICONDUCTOR DEVICE AND INFORMATION PROCESSING SYSTEM INCLUDING THE SAME

(75) Inventors: Homare Sato, Tokyo (JP); Junichi Hayashi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 244 days.

(21) Appl. No.: 12/923,749

(22) Filed: Oct. 6, 2010

(65) Prior Publication Data
US 2011/0085397 A1   Apr. 14, 2011

(30) Foreign Application Priority Data
Oct. 9, 2009   (JP) ................................. 2009-235479

(51) Int. Cl.
G11C 5/02   (2006.01)
H01L 23/12   (2006.01)

(52) U.S. Cl. ............ 365/51; 365/63; 365/200; 365/219; 365/230.03; 257/686; 257/777

(58) Field of Classification Search .................... 365/51, 365/63, 200, 230.03, 230.06, 219; 257/736, 257/686, 685, 678, 777
See application file for complete search history.

(56) References Cited

U.S. PATENT DOCUMENTS

| | | | | |
|---|---|---|---|---|
| 8,076,764 B2 * | 12/2011 | Yamada et al. | ................ | 257/686 |
| 2007/0126105 A1 | 6/2007 | Yamada et al. | | |
| 2008/0315408 A1 * | 12/2008 | Ko et al. | ........................ | 257/735 |
| 2012/0122251 A1 * | 5/2012 | Yamada et al. | .................. | 438/15 |

FOREIGN PATENT DOCUMENTS
JP   2007-157266 A   6/2007

* cited by examiner

Primary Examiner — Andrew Q Tran
(74) Attorney, Agent, or Firm — McGinn IP Law Group, PLLC

(57) ABSTRACT

A semiconductor device includes plural core chips and an interface chip that controls the plural core chips. Each of the plural core chips includes a layer address generating circuit that generates a second chip address by incrementing a value of a first chip address and a layer address comparing circuit that compares a third chip address supplied from the interface chip and the second chip address, and activates a chip selection signal when the third chip address and the second chip address are matched with each other. When a non-used chip signal is in an inactivated state, the layer address generating circuit supplies the second chip address to another core chip, and when the non-used chip signal is in an activated state, the layer address generating circuit supplies the first chip address to another core chip without a change.

20 Claims, 11 Drawing Sheets

SEMICONDUCTOR DEVICE AND INFORMATION PROCESSING SYSTEM INCLUDING THE SAME

BACKGROUND OF THE INVENTION

1. Field of the Invention

The present invention relates to a semiconductor device and an information processing system including the same. More particularly, the present invention relates to a semiconductor device that includes plural core chips and an interface chip to control the core chips and an information processing system including the same.

2. Description of the Related Art

A memory capacity that is required in a semiconductor device such as a dynamic random access memory (DRAM) has increased every year. In recent years, a memory device that is called a multi-chip package where plural memory chips are laminated is suggested to satisfy the required memory capacity. However, since the memory chip used in the multi-chip package is a common memory chip capable of operating even though the memory chip is a single chip, a so-called front end unit that performs a function of an interface with an external device (for example, memory controller) is included in each memory chip. For this reason, an area for a memory core in each memory chip is restricted to an area obtained by subtracting the area for the front end unit from a total chip area, and it is difficult to greatly increase a memory capacity for each chip (for each memory chip).

In addition, a circuit that constitutes the front end unit is manufactured at the same time as a back end unit including a memory core, regardless of the circuit being a circuit of a logic system. Therefore there have been a further problem that it is difficult to speed up the front end unit.

As a method to resolve the above problem, a method that integrates the front end unit and the back end unit in individual chips and laminates these chips, thereby constituting one semiconductor device, is suggested (for example, Japanese Patent Application Laid-Open (JP-A) No. 2007-157266). According to this method, with respect to plural core chips each of which is integrated with the back end unit without the front end unit, it becomes possible to increase a memory capacity for each chip (for each core chip) because an occupied area assignable for the memory core increases. Meanwhile, with respect to an interface chip that is integrated with the front end unit and is common to the plural core chips, it becomes possible to form its circuit with a high-speed transistor because the interface chip can be manufactured using a process different from that of the memory core. In addition, since the plural core chips can be allocated to one interface chip, it becomes possible to provide a semiconductor device that has a large memory capacity and a high operation speed as a whole.

However, this kind of semiconductor device is recognized as only one memory chip, in view of a controller. For this reason, when the plural core chips are allocated to one interface chip, how to perform an individual access to each core chip becomes a problem. In the case of the general multi-chip package, each memory chip is individually selected using a dedicated chip selection terminal (/CS) in each memory chip. Meanwhile, in the semiconductor device described above, since the chip selection terminal is provided in only the interface chip, each core chip cannot be individually selected by a chip selection signal.

In order to resolve this problem, JP-A No. 2007-157266 described above, a chip identification number is allocated to each core chip, a chip selection address is commonly provided from the interface chip to each core chip, and individual selection of each core chip is realized.

In JP-A No. 2007-157266 described above, the structure where core chips (DRAM chips) are laminated in five layers, an interface chip is laminated on the layers of the core chips, and the individual chips are connected by through silicon vias (hereinafter, "TSV") is disclosed. This chip-lamination-type semiconductor device is finished by manufacturing the individual chips, inspecting whether defects exist in the chips, laminating the chips, and packaging the chips.

Meanwhile, the defects of the core chips may be discovered at the time of inspection after the individual chips are assembled. In this case, since the remaining core chips and the interface chip are normally operated, all of the chips do not need to be removed. Accordingly, a method in which, even though the defects exist in the partial core chips, the semiconductor device is not regarded as a defective semiconductor device, use of only the defective core chips is stopped and only the normal core chips are operated to configure a partial product, and non-defective chips are saved is required.

However, in the chip-lamination-type semiconductor device according to the related art, a chip identification number that is received from a previous stage is incremented in the core chip and is transmitted to a core chip of a next stage, and a chip identification number of each core chip is allocated. For example, the chip-lamination-type semiconductor device is configured such that chip identification numbers of (0, 0, 0) to (1, 1, 1) are necessarily allocated to core chips of eight layers. Thereby, since unique chip identification numbers are allocated to the defective core chips, the interface chip needs to manage the chip identification numbers to disable an access to the defective core chips, and control is complicated.

SUMMARY

In one embodiment, there is provided a semiconductor device comprising: a plurality of core chips; and an interface chip that supplies a non-used chip signal to each of the plurality of core chips, wherein each of the plurality of core chips includes a chip address generating circuit that generates a second chip address to specify the corresponding core chip, on the basis of a first chip address, and when the non-used chip signal is in an inactivated state, the chip address generating circuit changes a value of the first chip address and supplies the first chip address to another core chip, and when the non-used chip signal is in an activated state, the chip address generating circuit does not change the value of the first chip address and supplies the first chip address to another core chip.

In another embodiment, there is provided an information processing system, comprising: the semiconductor device having the above feature and a controller that controls the semiconductor device, wherein the controller supplies the third chip address to the interface chip.

According to the present invention, when some core chips are set as non-used chips, allocation of layer addresses with respect to the non-used chips is skipped. Therefore, valid chip identification numbers can be allocated to only normal partial core chips and only the normal core chips can be operated, without requiring the controller to perform special control.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
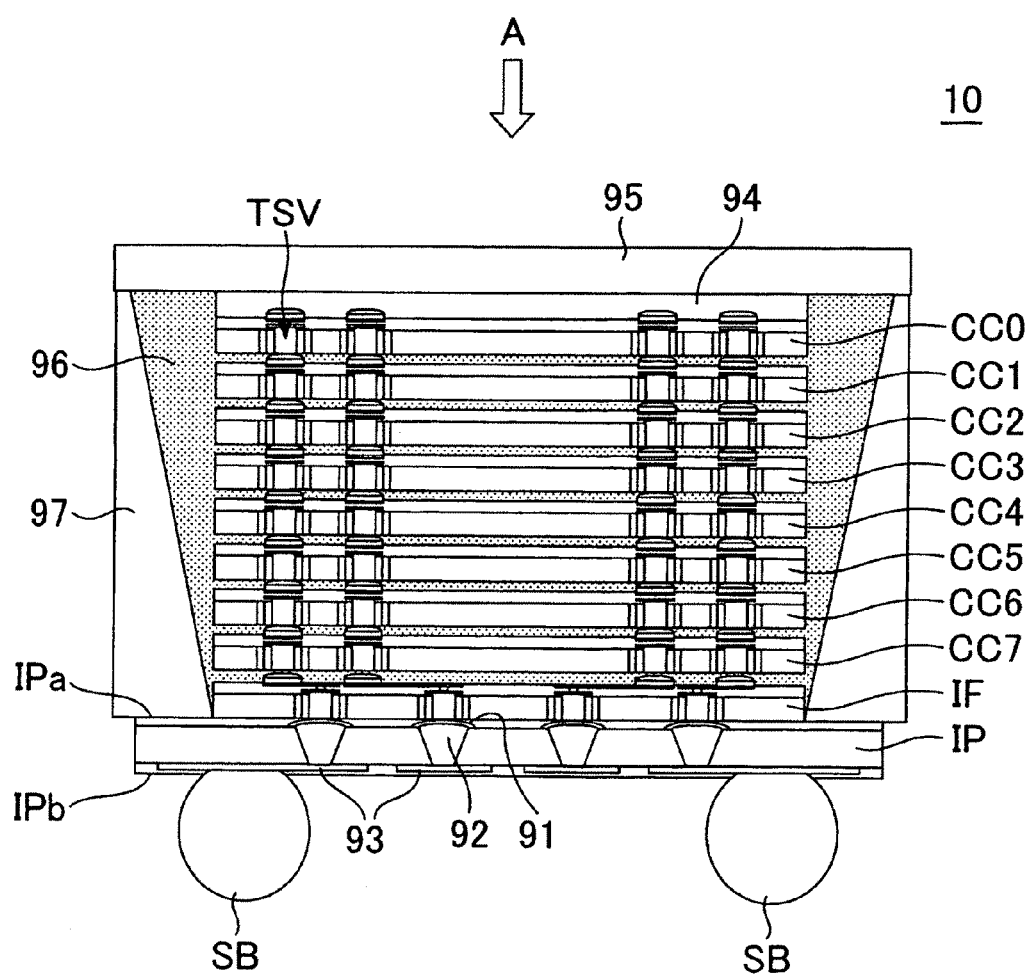
FIG. 1 is a schematic cross-sectional view illustrating the structure of a semiconductor device according to the preferred embodiment of the present invention.

FIG. 1 is a schematic cross-sectional view illustrating the structure of a semiconductor device according to the preferred embodiment of the present invention.

As shown in FIG. 1, the semiconductor device 10 according to this embodiment has the structure where 8 core chips CC0 to CC7 that have the same function and structure and are manufactured using the same manufacture mask, an interface chip IF that is manufactured using a manufacture mask different from that of the core chips and an interposer IP are laminated. The core chips CC0 to CC7 and the interface chip IF are semiconductor chips using a silicon substrate and are electrically connected to adjacent chips in a vertical direction through plural Through Silicon Vias (TSV) penetrating the silicon substrate. Meanwhile, the interposer IP is a circuit board that is made of a resin, and plural external terminals (solder balls) SB are formed in a back surface IPb of the interposer IP.

Each of the core chips CC0 to CC7 is a semiconductor chip which consists of circuit blocks other than a so-called front end unit (front end function) performing a function of an interface with an external device through an external terminal among circuit blocks included in a 1 Gb DDR3 (Double Data Rate 3)-type SDRAM (Synchronous Dynamic Random Access Memory). The SDRAM is a well-known and common memory chip that includes the front end unit and a so-called back end unit having a plural memory cells and accessing to the memory cells. The SDRAM operates even as a single chip and is capable to communicate directly with a memory controller. That is, each of the core chips CC0 to CC7 is a semiconductor chip where only the circuit blocks belonging to the back end unit are integrated in principle. As the circuit blocks that are included in the front end unit, a parallel-serial converting circuit (data latch circuit) that performs parallel/serial conversion on input/output data between a memory cell array and a data input/output terminal and a DLL (Delay Locked Loop) circuit that controls input/output timing of data are exemplified, which will be described in detail below. The interface chip IF is a semiconductor chip in which only the front end unit is integrated. Accordingly, an operation frequency of the interface chip is higher than an operation frequency of the core chip. Since the circuits that belong to the front end unit are not included in the core chips CC0 to CC7, the core chips CC0 to CC7 cannot be operated as the single chips, except for when the core chips are operated in a wafer state for a test operation in the course of manufacturing the core chips. The interface chip IF is needed to operate the core chips CC0 to CC7. Accordingly, the memory integration of the core chips is denser than the memory integration of a general single chip. In the semiconductor device 10 according to this embodiment, the interface chip has a front end function for communicating with the external device at a first operation frequency, and the plural core chips have a back end function for communicating with only the interface chip at a second operation frequency lower than the first operation frequency. Accordingly, each of the plural core chips includes a memory cell array that stores plural information, and a bit number of plural read data for each I/O (DQ) that are supplied from the plural core chips to the interface chip in parallel is plural and associated with a one-time read command provided from the interface chip to the core chips. In this case, the plural bit number corresponds to a prefetch data number to be well-known.

The interface chip IF functions as a common front end unit for the eight core chips CC0 to CC7. Accordingly, all external accesses are performed through the interface chip IF and inputs/outputs of data are also performed through the interface chip IF. In this embodiment, the interface chip IF is disposed between the interposer IP and the core chips CC0 to CC7. However, the position of the interface chip IF is not restricted in particular, and the interface chip IF may be disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the TSV does not need to be provided in the interface chip IF. The interface chip IF may be disposed to be interposed between the two interposers IP.

The interposer IP functions as a rewiring substrate to increase an electrode pitch and secures mechanical strength of the semiconductor device 10. That is, an electrode 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 1, only the two external terminals SB are shown. In actuality, however, three or more external terminals are provided. The layout of the external terminals SB is the same as that of the DDR3-type SDRAM that is determined by the regulation. Accordingly, the semiconductor device can be treated as one DDR3-type SDRAM from the external controller.

As shown in FIG. 1, a top surface of the uppermost core chip CC0 is covered by an NCF (Non-Conductive Film) 94 and a lead frame 95. Gaps between the core chips CC0 to CC7 and the interface chip IF are filled with an underfill 96 and surrounding portions of the gaps are covered by a sealing resin 97. Thereby, the individual chips are physically protected.

Figures 2A, 2B, 2C:
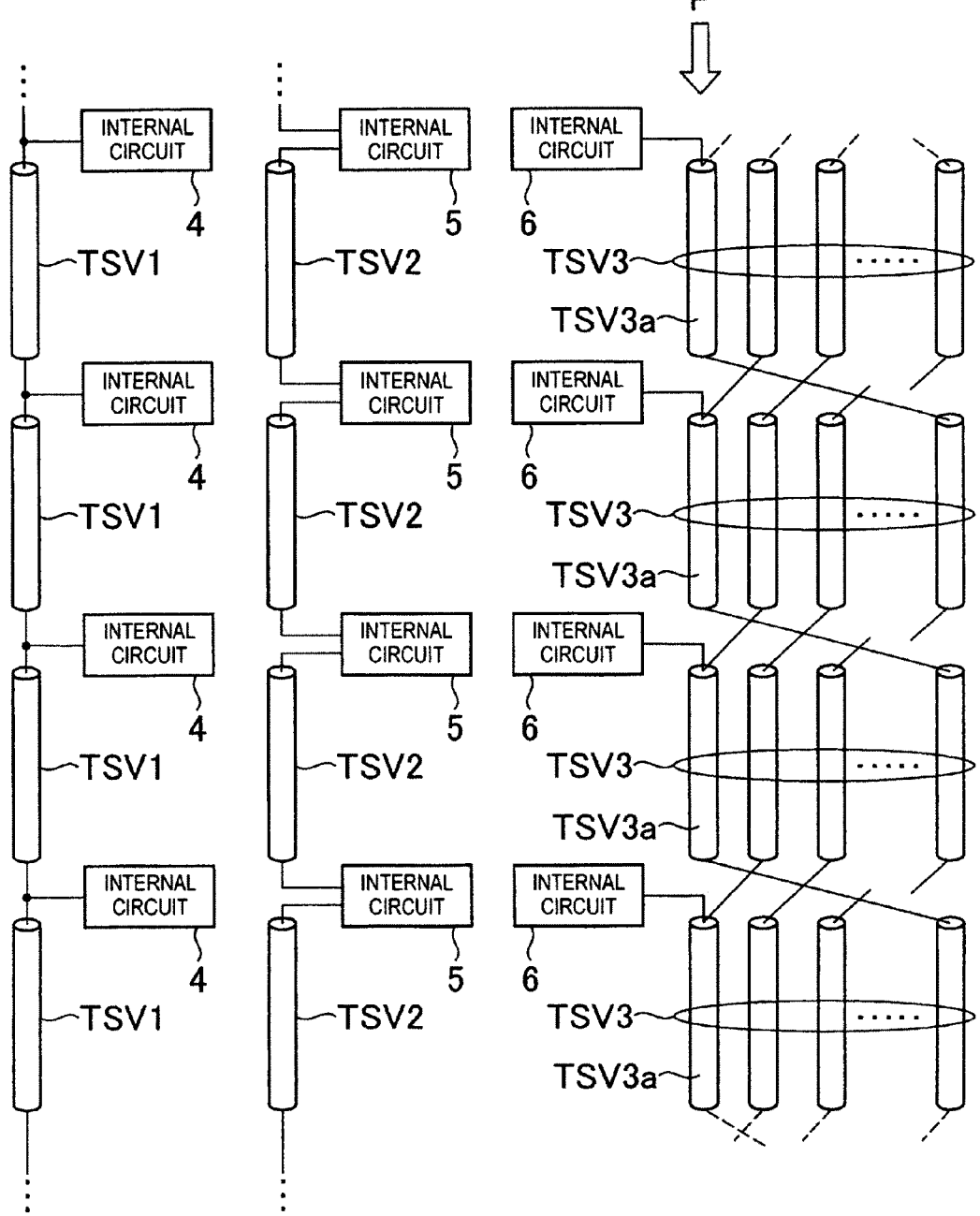
FIGS. 2A to 2C are diagrams to explain the various types of TSV provided in a core chip.

When most of the TSVs provided in the core chips CC0 to CC7 are two-dimensionally viewed from a lamination direction, that is, viewed from an arrow A shown in FIG. 1, the TSVs are short-circuited from the TSVs of other layers provided at the same position. That is, as shown in FIG. 2A, the vertically disposed TSV1s that are provided at the same position in plain view are short-circuited, and one wiring line is configured by the TSV1. The TSV1 that are provided in the core chips CC0 to CC7 are connected to internal circuits 4 in the core chips, respectively. Accordingly, input signals (command signal, address signal, etc.) that are supplied from the interface chip IF to the TSV1s shown in FIG. 2A are commonly input to the internal circuits 4 of the core chips CC0 to CC7. Output signals (data etc.) that are supplied from the core chips CC0 to CC7 to the TSV1 are wired-ORed and input to the interface chip IF.

Meanwhile, as shown in FIG. 2B, the a part of TSVs are not directly connected to the TSV2 of other layers provided at the same position in plain view but are connected to the TSV2 of other layers through the internal circuits 5 provided in the core chips CC0 to CC7. That is, the internal circuits 5 that are provided in the core chips CC0 to CC7 are cascade-connected through the TSV2. This kind of TSV2 is used to sequentially transmit predetermined information to the internal circuits 5 provided in the core chips CC0 to CC7. As this information, layer address information to be described below is exemplified.

Another TSV group is short-circuited from the TSVs of other layer provided at the different position in plan view, as shown in FIG. 2C. With respect to this kind of TSV group 3, internal circuits 6 of the core chips CC0 to CC7 are connected to the TSV3a provided at the predetermined position P in plain view. Thereby, information can be selectively input to the internal circuits 6 provided in the core chips. As this information, non-used chip information to be described below is exemplified.

As such, as types of the TSVs provided in the core chips CC0 to CC7, three types (TSV1 to TSV3) shown in FIGS. 2A to 2C exist. As described above, most of the TSVs are of a type shown in FIG. 2A, and an address signal, a command signal, and a clock signal are supplied from the interface chip IF to the core chips CC0 to CC7, through the TSV1 of the type shown in FIG. 2A. Read data and write data are input to and output from the interface chip IF through the TSV1 of the type shown in FIG. 2A. Meanwhile, the TSV2 and TSV3 of the types shown in FIGS. 2B and 2C are used to provide individual information to the core chips CC0 to CC7 having the same structure.

Figure 3:
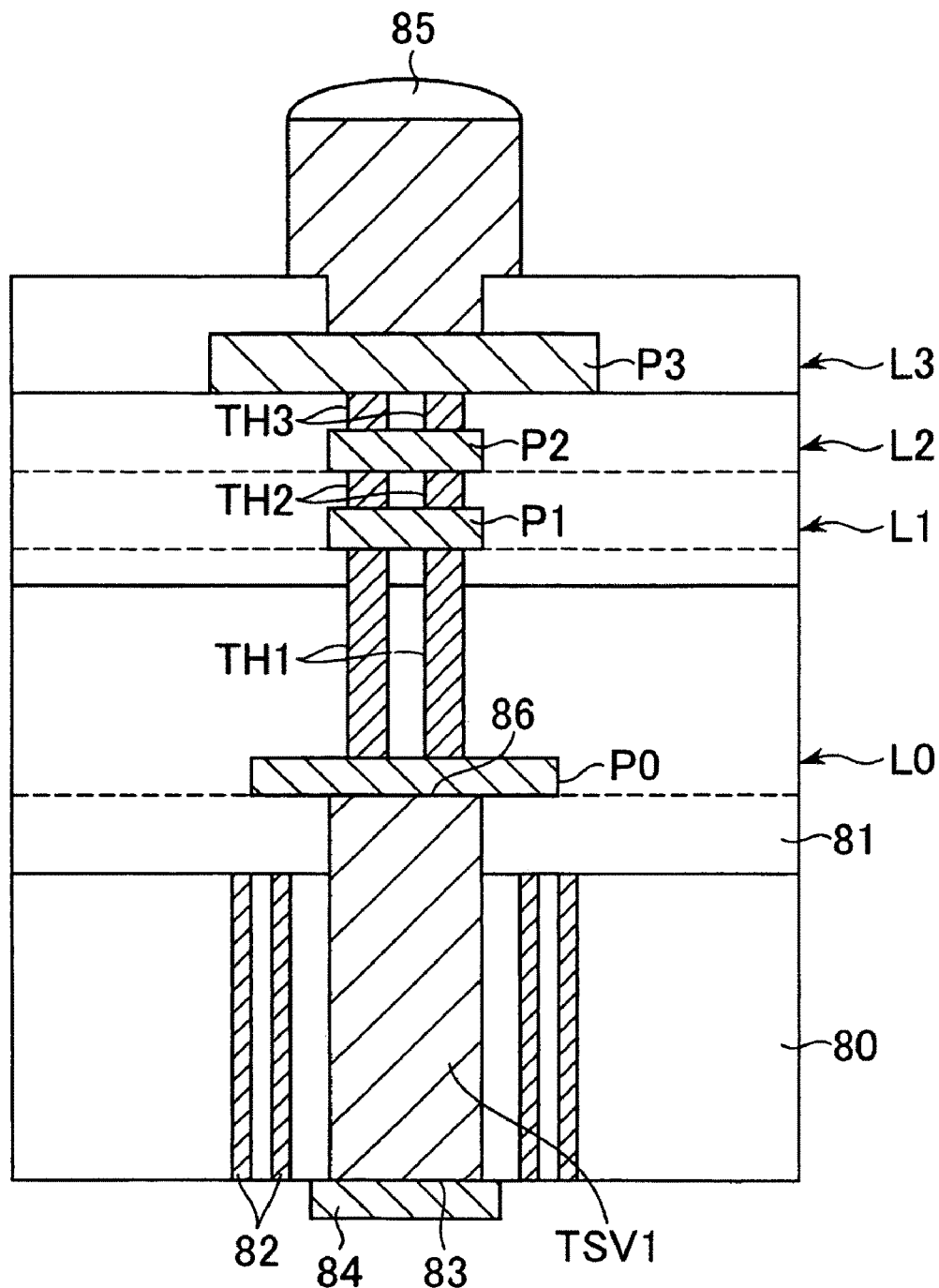
FIG. 3 is a cross-sectional view illustrating the structure of TSV of the type shown in FIG. 2A.

FIG. 3 is a cross-sectional view illustrating the structure of the TSV1 of the type shown in FIG. 2A.

As shown in FIG. 3, the TSV1 is provided to penetrate a silicon substrate 80 and an interlayer insulating film 81 provided on a surface of the silicon substrate 80. Around the TSV1, an insulating ring 82 is provided. Thereby, the TSV1 and a transistor region are insulated from each other. In an example shown in FIG. 3, the insulating ring 82 is provided double. Thereby, capacitance between the TSV1 and the silicon substrate 80 is reduced.

An end 83 of the TSV1 at the back surface of the silicon substrate 80 is covered by a back surface bump 84. The back surface bump 84 is an electrode that contacts a surface bump 85 provided in a core chip of a lower layer. The surface bump 85 is connected to an end 86 of the TSV1, through plural pads P0 to P3 provided in wiring layers L0 to L3 and plural through-hole electrodes TH1 to TH3 connecting the pads to each other. Thereby, the surface bump 85 and the back surface bump 84 that are provided at the same position in plain view are short-circuited. Connection with internal circuits (not shown in the drawings) is performed through internal wiring lines (not shown in the drawings) drawn from the pads P0 to P3 provided in the wiring layers L0 to L3.

Figure 4:
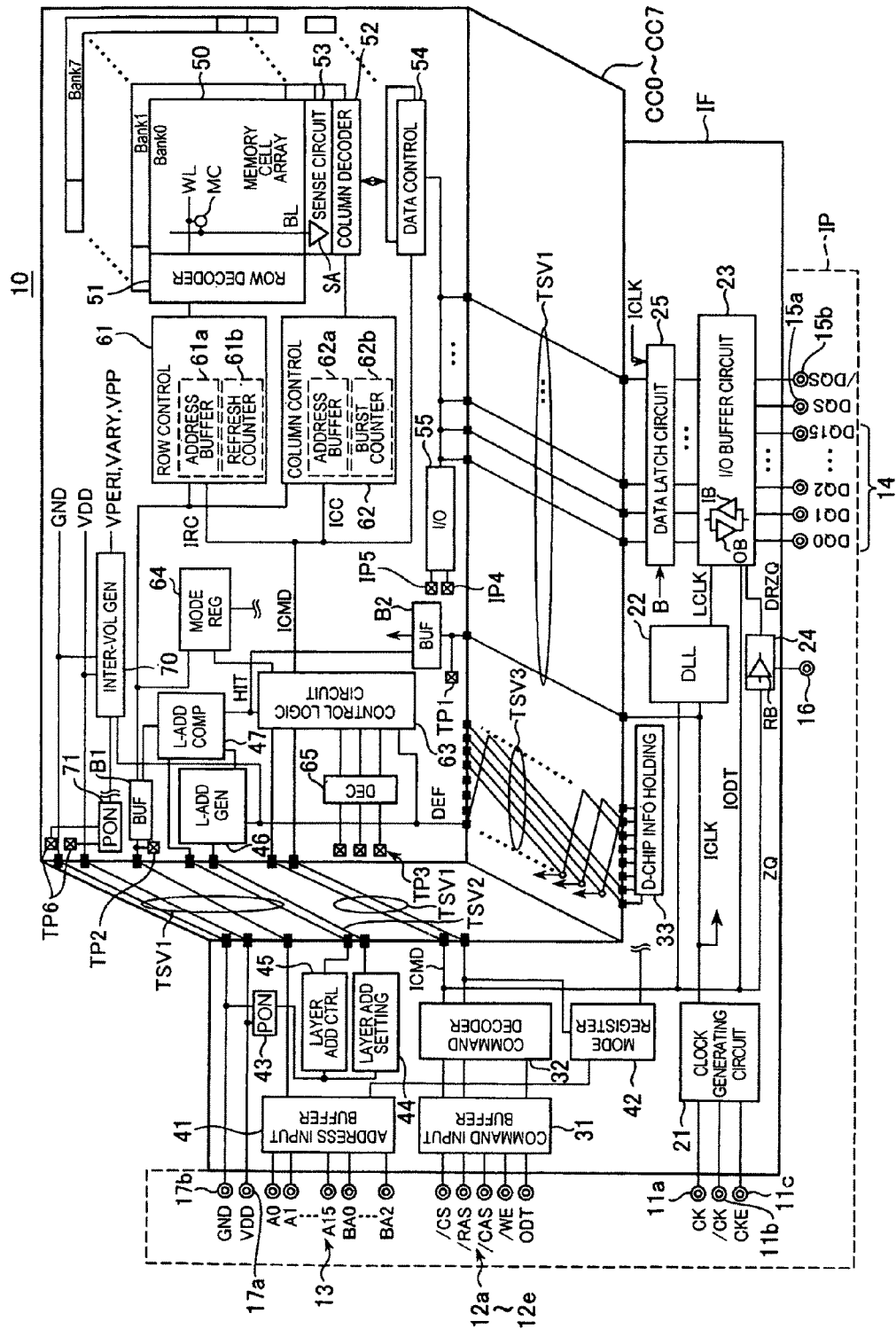
FIG. 4 is a block diagram illustrating the circuit configuration of the semiconductor device.

FIG. 4 is a block diagram illustrating the circuit configuration of the semiconductor device 10.

As shown in FIG. 4, the external terminals that are provided in the interposer IP include clock terminals 11a and 11b, an clock enable terminal 11c, command terminals 12a to 12e, an address terminal 13, a data input/output terminal 14, data strobe terminals 15a and 15b, a calibration terminal 16, and power supply terminals 17a and 17b. All of the external terminals are connected to the interface chip IF and are not directly connected to the core chips CC0 to CC7, except for the power supply terminals 17a and 17b.

First, a connection relationship between the external terminals and the interface chip IF performing the front end function and the circuit configuration of the interface chip IF will be described.

The clock terminals 11a and 11b are supplied with external clock signals CK and /CK, respectively, and the clock enable terminal 11c is supplied with a clock enable signal CKE. The external clock signals CK and /CK and the clock enable signal CKE are supplied to a clock generating circuit 21 provided in the interface chip IF. A signal where "/" is added to a head of a signal name in this specification indicates an inversion signal of a corresponding signal or a low-active signal. Accordingly, the external clock signals CK and /CK are complementary signals. The clock generating circuit 21 generates an internal clock signal ICLK, and the generated internal clock signal ICLK is supplied to various circuit blocks in the interface chip IF and is commonly supplied to the core chips CC0 to CC7 through the TSVs.

A DLL circuit 22 is included in the interface chip IF and an input/output clock signal LCLK is generated by the DLL circuit 22. The input/output clock signal LCLK is supplied to an input/output buffer circuit 23 included in the interface chip IF. A DLL function is used to control the front end unit by using the signal LCLK synchronized with a signal of the external device, when the semiconductor device 10 communicates with the external device. Accordingly, DLL function is not needed for the core chips CC0 to CC7 as the back end.

The command terminals 12a to 12e are supplied with a row-address strobe signal /RAS, a column address strobe signal /CAS, a write enable signal /WE, a chip select signal /CS, and an on-die termination signal ODT. These command signals are supplied to a command input buffer 31 that is provided in the interface chip IF. The command signals supplied to the command input buffer 31 are further supplied to a command decoder 32. The command decoder 32 is a circuit that holds, decodes, and counts the command signals in synchronization with the internal clock ICLK and generates various internal commands ICMD. The generated internal command ICMD is supplied to the various circuit blocks in the interface chip IF and is commonly supplied to the core chips CC0 to CC7 through the TSVs.

The address terminal 13 is a terminal to which address signals A0 to A15 and BA0 to BA2 are supplied, and the supplied address signals A0 to A15 and BA0 to BA2 are supplied to an address input buffer 41 provided in the interface chip IF. An output of the address input buffer 41 is commonly supplied to the core chips CC0 to CC7 through the TSVs. The address signals A0 to A15 are supplied to a mode register 42 provided in the interface chip IF, when the semiconductor device 10 enters a mode register set. The address signals BA0 to BA2 (bank addresses) are decoded by an address decoder (not shown in the drawings) provided in the interface chip IF, and a bank selection signal B that is obtained by the decoding is supplied to a data latch circuit 25. This is because bank selection of the write data is performed in the interface chip IF.

The data input/output terminal 14 is used to input/output read data or write data DQ0 to DQ15. The data strobe terminals 15a and 15b are terminals that are used to input/output strobe signals DQS and /DQS. The data input/output terminal 14 and the data strobe terminals 15a and 15b are connected to the input/output buffer circuit 23 provided in the interface chip IF. The input/output buffer circuit 23 includes an input buffer IB and an output buffer OB, and inputs/outputs the read data or the write data DQ0 to DQ15 and the strobe signals DQS and /DQS in synchronization with the input/output clock signal LCLK supplied from the DLL circuit 22. If an internal on-die termination signal IODT is supplied from the command decoder 32, the input/output buffer circuit 23 causes the output buffer OB to function as a termination resistor. An impedance code DRZQ is supplied from the calibration circuit 24 to the input/output buffer circuit 23. Thereby, impedance of the output buffer OB is designated. The input/output buffer circuit 23 includes a well-known FIFO circuit.

The calibration circuit 24 includes a replica buffer RB that has the same circuit configuration as the output buffer OB. If the calibration signal ZQ is supplied from the command decoder 32, the calibration circuit 24 refers to a resistance value of an external resistor (not shown in the drawings) connected to the calibration terminal 16 and performs a calibration operation. The calibration operation is an operation for matching the impedance of the replica buffer RB with the resistance value of the external resistor, and the obtained impedance code DRZQ is supplied to the input/output buffer circuit 23. Thereby, the impedance of the output buffer OB is adjusted to a desired value.

The input/output buffer circuit 23 is connected to a data latch circuit 25. The data latch circuit 25 includes a FIFO circuit (not shown in the drawings) that realizes a FIFO function which operates by latency control realizing the well-known DDR function and a multiplexer MUX (not shown in the drawings). The input/output buffer circuit 23 converts parallel read data, which is supplied from the core chips CC0 to CC7, into serial read data, and converts serial write data, which is supplied from the input/output buffer, into parallel write data. Accordingly, the data latch circuit 25 and the input/output buffer circuit 23 are connected in serial and the data latch circuit 25 and the core chips CC0 to CC7 are connected in parallel. In this embodiment, each of the core chips CC0 to CC7 is the back end unit of the DDR3-type SDRAM and a prefetch number is 8 bits. The data latch circuit 25 and each banks of the core chips CC0 to CC7 are connected respectively, and the number of banks that are included in each of the core chips CC0 to CC7 is 8. Accordingly, connection of the data latch circuit 25 and the core chips CC0 to CC7 becomes 64 bits (8 bits×8 banks) for each DQ.

Parallel data, not converted into serial data, is basically transferred between the data latch circuit 25 and the core chips CC0 to CC7. That is, in a common SDRAM (in the SDRAM, a front end unit and a back end unit are constructed in one chip), between the outside of the chip and the SDRAM, data is input/output in serial (that is, the number of data input/output terminals is one for each DQ). However, in the core chips CC0 to CC7, an input/output of data between the interface chip IF and the core chips is performed in parallel. This point is the important difference between the common SDRAM and the core chips CC0 to CC7. However, all of the prefetched parallel data do not need to be input/output using the different TSVs, and partial parallel/serial conversion may be performed in the core chips CC0 to CC7 and the number of TSVs that are needed for each DQ may be reduced. For example, all of data of 64 bits for each DQ do not need to be input/output using the different TSVs, and 2-bit parallel/serial conversion may be performed in the core chips CC0 to CC7 and the number of TSVs that are needed for each DQ may be reduced to ½ (32).

To the data latch circuit 25, a function for enabling a test in an interface chip unit is added. The interface chip does not have the back end unit. For this reason, the interface chip cannot be operated as a single chip in principle. However, if the interface chip never operates as the single chip, an operation test of the interface chip in a wafer state may not be performed. This means that the semiconductor device 10 cannot be tested in case an assembly process of the interface chip and the plural core chips is not executed, and the interface chip is tested by testing the semiconductor device 10. In this case, when a defect that cannot be recovered exists in the interface chip, the entire semiconductor device 10 is not available. In consideration of this point, in this embodiment, a portion of a pseudo back end unit for a test is provided in the data latch circuit 25, and a simple memory function is enabled at the time of a test.

The power supply terminals 17a and 17b are terminals to which power supply potentials VDD and VSS are supplied, respectively. The power supply terminals 17a and 17b are connected to a power-on detecting circuit 43 provided in the interface chip IF and are also connected to the core chips CC0 to CC7 through the TSVs. The power-on detecting circuit 43 detects the supply of power. On detecting the supply of power, the power-on detecting circuit 43 activates a layer address control circuit 45 on the interface chip IF.

The layer address control circuit 45 changes a layer address due to the I/O configuration of the semiconductor device 10 according to the present embodiment. As described above, the semiconductor device 10 includes 16 data input/output terminals 14. Thereby, a maximum I/O number can be set to 16 bits (DQ0 to DQ15). However, the I/O number is not fixed to 16 bits and may be set to 8 bits (DQ0 to DQ7) or 4 bits (DQ0 to DQ3). The address allocation is changed according to the I/O number and the layer address is also changed. The layer address control circuit 45 changes the address allocation according to the I/O number and is commonly connected to the core chips CC0 to CC7 through the TSVs.

The interface chip IF is also provided with a layer address setting circuit 44. The layer address setting circuit 44 is connected to the core chips CC0 to CC7 through the TSVs. The layer address setting circuit 44 is cascade-connected to the layer address generating circuit 46 of the core chips CC0 to CC7 using the TSV2 of the type shown in FIG. 2B, and reads out the layer addresses set to the core chips CC0 to CC7 at testing.

The interface chip IF is also provided with a non-used chip information holding circuit 33. When a defective core chip that does not normally operates is discovered after an assembly, the non-used chip information holding circuit 33 holds its chip number. The non-used chip information holding circuit 33 is connected to the core chips CC0 to CC7 through the TSVs. The non-used chip information holding circuit 33 is connected to the core chips CC0 to CC7 while being shifted, using the TSV3 of the type shown in FIG. 2C.

The above description is the outline of the connection relationship between the external terminals and the interface chip IF and the circuit configuration of the interface chip IF. Next, the circuit configuration of the core chips CC0 to CC7 will be described.

As shown in FIG. 4, memory cell arrays 50 that are included in the core chips CC0 to CC7 performing the back end function are divided into eight banks. A bank is a unit that can individually receive a command. That is, the individual banks can be independently and nonexclusively controlled. From the outside of the semiconductor device 10, each back can be independently accessed. For example, a part of the memory cell array 50 belonging to the bank 1 and another part of the memory cell array 50 belonging to the bank 2 are controlled nonexclusively. That is, word lines WL and bit lines BL corresponding to each banks respectively are independently accessed at same period by different commands one another. For example, while the bank 1 is maintained to be active (the word lines and the bit lines are controlled to be active), the bank 2 can be controlled to be active. However, the external terminals (for example, plural control terminals and plural I/O terminals) of the semiconductor device 10 are shared. In the memory cell array 50, the plural word lines WL and the plural bit lines BL intersect each other, and memory cells MC are disposed at intersections thereof (in FIG. 4, only one word line WL, one bit line BL, and one memory cell MC are shown). The word line WL is selected by a row decoder 51. The bit line BL is connected to a corresponding sense amplifier SA in a sense circuit 53. The sense amplifier SA is selected by a column decoder 52.

The row decoder 51 is controlled by a row address supplied from a row control circuit 61. The row control circuit 61 includes an address buffer 61a that receives a row address supplied from the interface chip IF through the TSV, and the row address that is buffered by the address buffer 61a is supplied to the row decoder 51. The address signal that is supplied through the TSV is supplied to the row control circuit 61 through the input buffer B1. The row control circuit 61 also includes a refresh counter 61b. When a refresh signal is issued by a control logic circuit 63, a row address that is indicated by the refresh counter 61b is supplied to the row decoder 51.

The column decoder 52 is controlled by a column address supplied from a column control circuit 62. The column control circuit 62 includes an address buffer 62a that receives the column address supplied from the interface chip IF through the TSV, and the column address that is buffered by the address buffer 62a is supplied to the column decoder 52. The column control circuit 62 also includes a burst counter 62b that counts the burst length.

The sense amplifier SA selected by the column decoder 52 is connected to the data control circuit 54 through some amplifiers (sub-amplifiers or data amplifiers or the like) which are not shown in the drawings. Thereby, read data of 8 bits (=prefetch number) for each I/O (DQ) is output from the data control circuit 54 at reading, and write data of 8 bits is input to the data control circuit 54 at writing. The data control circuit 54 and the interface chip IF are connected in parallel through the TSV.

The control logic circuit 63 receives an internal command ICMD supplied from the interface chip IF through the TSV and controls the row control circuit 61 and the column control circuit 62, based on the internal command ICMD. The control logic circuit 63 is connected to a layer address comparing circuit (chip information comparing circuit) 47. The layer address comparing circuit 47 detects whether the corresponding core chip is target of access, and the detection is performed by comparing a SEL (chip selection information/third chip address) which is a part of the address signal supplied from the interface chip IF through the TSV and a layer address LID (chip identification information/second chip address) set to the layer address generating circuit 46.

In the layer address generating circuit (chip address generating circuit) 46, unique layer addresses are set to the core chips CC0 to CC7, respectively, at the time of initialization. A method of setting the layer addresses is as follows. First, if the semiconductor device 10 is initialized, a minimum value (0, 0, 0) as an initial value of a first chip address corresponding to the layer address is set to each of the layer address generating circuits 46 of the core chips CC0 to CC7. The layer address generating circuits 46 of the core chips CC0 to CC7 are cascade-connected using the TSVs of the type shown in FIG. 2B, and have increment circuits provided therein. The layer address (0, 0, 0) that is set to the layer address generating circuit 46 of the core chip CC0 of the uppermost layer is transmitted to the layer address generating circuit 46 of the second core chip CC1 through the TSV and is incremented. As a result, a different layer address (0, 0, 1) is generated. Hereinafter, in the same way as the above case, generated layer addresses are transmitted to the core chips of the lower layers and the layer address generating circuits 46 in the core chips increment the transmitted layer addresses. A maximum value (1, 1, 1) as a layer address is set to the layer address generating circuit 46 of the core chip CC7 of the lowermost layer. Thereby, the unique layer addresses are set to the core chips CC0 to CC7, respectively.

In the layer address generating circuit 46, non-used chip signals DEF are supplied from the non-used chip information holding circuit 33 of the interface chip IF through the TSV. Since each of the non-used chip signals DEF is supplied to an associated one of the core chips CC0 to CC7 using the TSV3 of the type shown in FIG. 2C, the individual non-used chip signals DEF can be supplied to the core chips CC0 to CC7. Each of the non-used chip signals DEF is a signal that is activated when the corresponding core chip is a defective chip. When the non-used chip signal DEF is activated, the layer address generating circuit 46 transmits, to the core chip of the lower layer, a non-incremented layer address, not an incremented layer address. The non-used chip signal DEF is also supplied to the layer address comparing circuit 47. When the non-used chip signal DEF is activated, a comparison result of the layer addresses is compulsorily set to mismatching. An output of the layer address comparing circuit 47 is supplied to the control logic circuit 63. However, if a matching signal is not output, the control logic circuit is not activated. For this reason, in the case of mismatching, the operation of the control logic circuit 63 is stopped. That is, a defective core chip does not perform a read operation or a write operation, even though an address signal or a command signal is input from the interface chip IF.

To the layer address comparing circuit 47, a partial signal is also supplied through the TSV1. The partial signal is supplied from the non-used chip information holding circuit 33, but a dedicated circuit that supplies the partial signal may be provided. Since the partial signal is supplied to all of the core chips CC0 to CC7 using the TSV1 of the type shown in FIG. 2A, a common partial signal can be supplied to the individual core chips CC0 to CC7. The partial signal is a signal that is activated when at least one of the core chips CC0 to CC7 is a defective chip and the semiconductor device 10 is used as a partial product. When the partial signal is activated, a bit number of the layer addresses that are compared in the layer address comparing circuit 47 becomes 2 bits and is switched into a layer address number corresponding to the partial product.

An output of the control logic circuit 63 is also supplied to a mode register 64. When an output of the control logic circuit 63 shows a mode register set, the mode register 64 is updated by an address signal. Thereby, operation modes of the core chips CC0 to CC7 are set.

Each of the core chips CC0 to CC7 has an internal voltage generating circuit 70. The internal voltage generating circuit 70 is provided with power supply potentials VDD and VSS. The internal voltage generating circuit 70 receives these power supply potentials and generates various internal voltages. As the internal voltages that are generated by the internal voltage generating circuit 70, an internal voltage VPERI (≈VDD) for operation power of various peripheral circuits, an internal voltage VARY (<VDD) for an array voltage of the memory cell array 50, and an internal voltage VPP (>VDD) for an activation potential of the word line WL are included. In each of the core chips CC0 to CC7, a power-on detecting circuit 71 is also provided. When the supply of power is detected, the power-on detecting circuit 71 resets various internal circuits.

The peripheral circuits in the core chips CC0 to CC7 operates in synchronization with the internal clock signal ICLK that is supplied from the interface chip IF through the TSV. The internal clock signal ICLK supplied through the TSV is supplied to the various peripheral circuits through the input buffer B2.

The above description is the basic circuit configuration of the core chips CC0 to CC7. In the core chips CC0 to CC7, the front end unit for an interface with the external device is not provided. Therefore the core chip cannot operate as a single chip in principle. However, if the core chip never operates as the single chip, an operation test of the core chip in a wafer state may not be performed. This means that the semiconductor device 10 cannot be tested, before the interface chip and the plural core chips are fully assembled. In other words, the individual core chips are tested when testing the semiconductor device 10. When unrecoverable defect exists in the core chips, the entire semiconductor device 10 is led to be unavailable. In this embodiment, in the core chips CC0 to CC7, a portion of a pseudo front end unit, for testing, that includes some test pads TP and a test front end unit of a test command decoder 65 is provided, and an address signal and test data or a command signal can be input from the test pads TP. It is noted that the test front end unit is provided for a simple test in a wafer test, and does not have all of the front end functions in the interface chip. For example, since an operation frequency of the core chips is lower than an operation frequency of the front end unit, the test front end unit can be simply realized with a circuit that performs a test with a low frequency.

Kinds of the test pads TP are almost the same as those of the external terminals provided in the interposer IP. Specifically, the test pads include a test pad TP1 to which a clock signal is input, a test pad TP2 to which an address signal is input, a test pad TP3 to which a command signal is input, a test pad TP4 for input/output test data, a test pad TP5 for input/output a data strobe signal, and a test pad TP6 for a power supply potential.

A common external command (not decoded) is input at testing. Therefore, the test command decoder 65 is also provided in each of the core chips CC0 to CC7. Because serial test data is input and output at testing, a test input/output circuit 55 is also provided in each of the core chips CC0 to CC7.

This is the entire configuration of the semiconductor device 10. Because in the semiconductor device 10, the 8 core chips of 1 Gb are laminated, the semiconductor device 10 has a memory capacity of 8 Gb in total. Because the chip selection signal /CS is input to one terminal (chip selection terminal), the semiconductor device is recognized as a single DRAM having the memory capacity of 8 Gb, in view of the controller.

Figure 5:
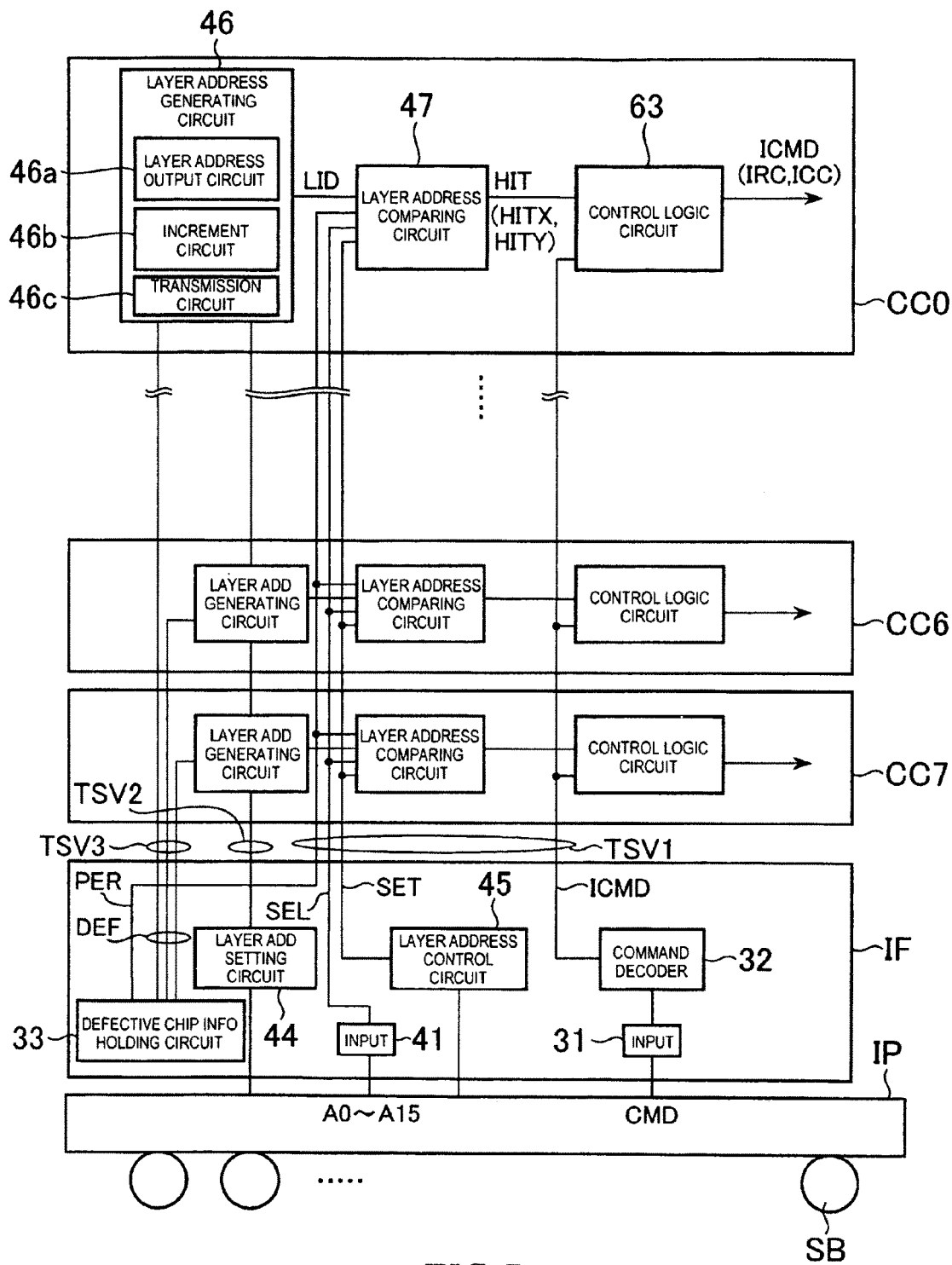
FIG. 5 is a diagram showing a circuit associated with selection of the core chips.
Figure 6:
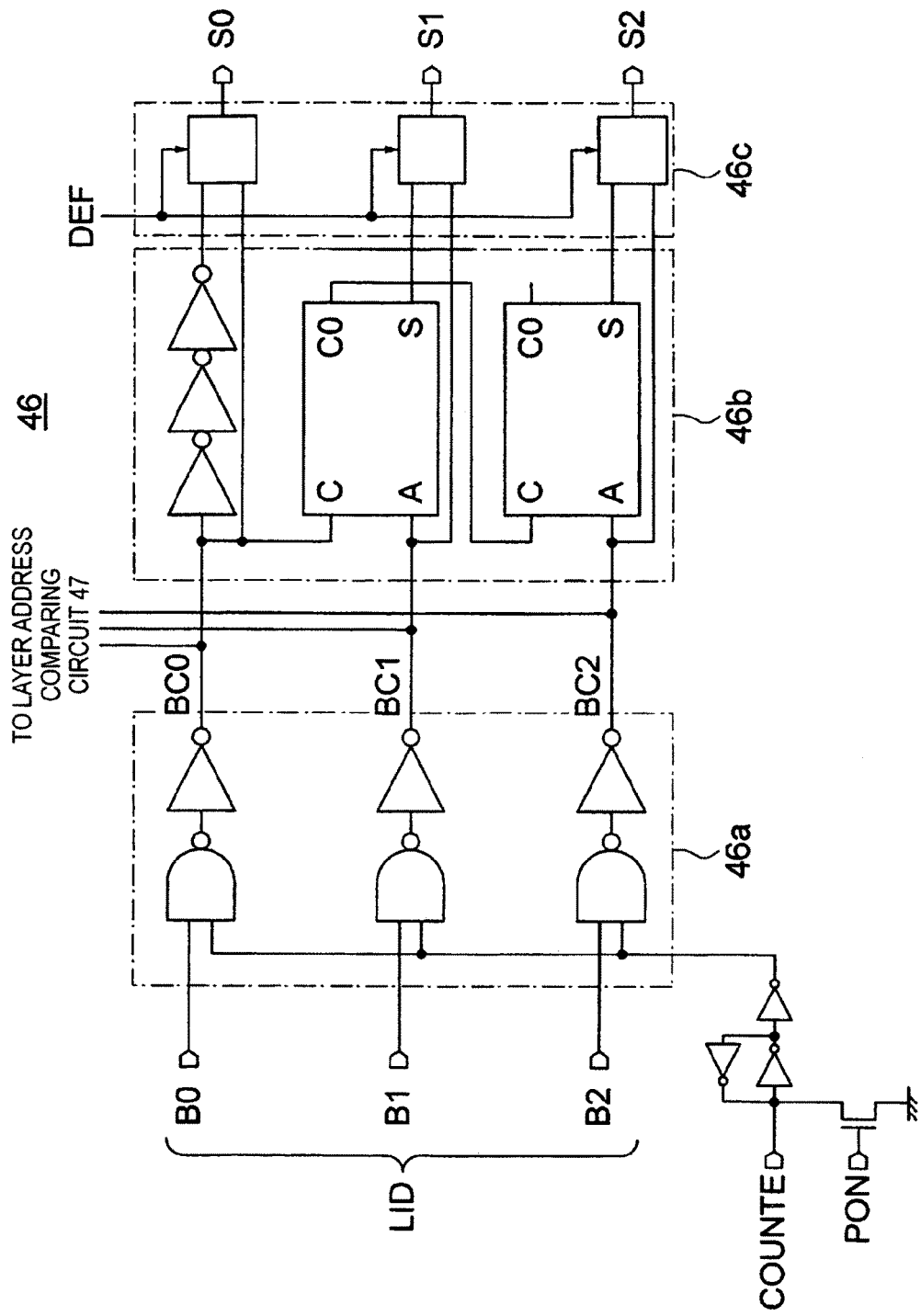
FIG. 6 is a circuit diagram showing an example of the configuration of the layer address generating circuit.

FIG. 5 is a diagram showing extraction of a circuit that is associated with selection of the core chips CC0 to CC7. FIG. 6 is a circuit diagram showing an example of the configuration of the layer address generating circuit 46.

As shown in FIG. 5, the layer address generating circuits (chip address generating circuits) 46 are provided in the core chips CC0 to CC7, respectively, and are cascade-connected through the TSV2 of the type shown in FIG. 2B. The layer address generating circuit 46 includes a layer address output circuit 46a, an increment circuit 46b, and a transmission circuit 46c.

As shown in FIG. 6, the layer address output circuit 46a is a logic circuit that outputs a 3-bit layer address (chip identification number) LID. If a level of the power-on/reset signal PON that is supplied from the power-on detecting circuit 71 shown in FIG. 4 becomes a high level, the layer address output circuit 46a is reset, and the chip identification numbers of all of the core chips are reset to (0, 0, 0). Then, if the level of the power-on/reset signal PON returns to a low level, a layer address LID (B2, B1, B0) corresponding to the first chip address is received from the outside. In this embodiment, the layer address LID (B2, B1, B0) is supplied from the core chip of a layer on the corresponding layer. In the case of the core chip CC0 of the uppermost layer, since a core chip does not exist on a layer on the uppermost layer, a layer address input terminal is opened.

The layer address output circuit 46a also receives a count enable signal COUNTE. A level of the count enable signal COUNTE of the core chip CC0 of the uppermost layer is set to a low level (open) and a level of the count enable signal COUNTE of each of the core chips of the other layers is set to a high level (VPERI). For this reason, in the case of the core chip CC0 of the uppermost layer, (0, 0, 0) is compulsorily output by the count enable signal COUNTE that is input to a NAND gate in the layer address output circuit 46a, regardless of a value of the layer address LID (B2, B1, B0) received from the outside. In the case of the other layers, the layer address LID (B2, B1, B0) received from the outside passes through the NAND gate in the layer address output circuit 46a without a change. In this way, a layer address LID (BC0, BC1, BC2) that is output from the layer address output circuit 46a is adopted as a layer address (second chip address) of the corresponding core chip and is supplied to the layer address comparing circuit 47.

Next, the increment circuit 46b outputs a value that is obtained by incrementing a layer address LID (BC2, BC1, BC0) of the corresponding core chip. The increment circuit 46b of the core chip CC0 of the uppermost layer generates a value (0, 0, 1) that is obtained by incrementing the layer address LID (0, 0, 0) set to the layer address output circuit 46a and the value is transmitted to the core chip CC1 of the lower layer by the transmission circuit 46c. The transmitted layer address LID (0, 0, 1) is adopted as the layer address of the core chip CC1.

Even in the core chip CC1, a value (0, 1, 0) that is obtained by incrementing the layer address LID (0, 0, 1) in the layer address register 46a by the increment circuit 46b is transmitted to the core chip CC2 of the lower layer by the transmission circuit 46c.

Hereinafter, in the same way as the above case, the incremented layer addresses LID are sequentially transmitted to the core chips of the lower layers. Finally, a maximum value (1, 1, 1) is set to the layer address register 46a of the core chip CC7 of the lowermost layer. Thereby, each of the core chips CC0 to CC7 has a unique layer address LID.

In the above description, it is assumed that all of the core chips are non-defective products. However, when the defective chips exist, a so-called partial product needs to be configured by stopping the use of only the defective chips and saving the normal core chips. In this case, setting of the layer addresses is as follows.

As shown in FIG. 5, the non-used chip signals DEF are supplied from the non-used chip information holding circuit 33 of the interface chip IF to the layer address generating circuit 46, through the TSV3 of the type shown in FIG. 2C. The non-used chip signals DEF are an 8-bit signal and individual bits are supplied to the corresponding core chips CC0 to CC7. The core chip where the corresponding bit of the non-used chip signals DEF is activated is a defective chip or a chip that is regarded as the defective chip and is not intentionally used.

Figure 7:
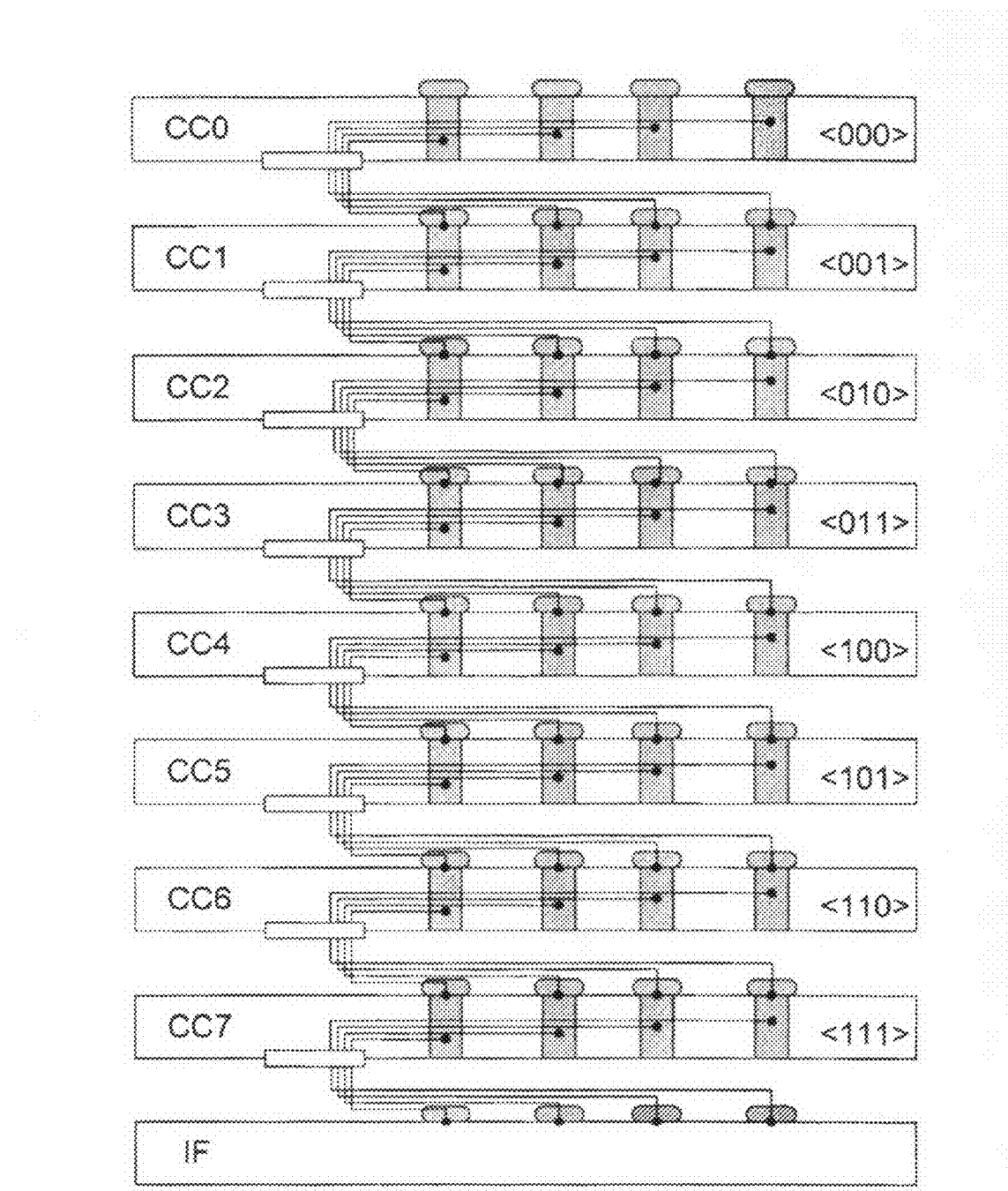
FIG. 7 is a schematic diagram showing one example of allocation of the layer address when all core chips are not defective.

As described above, in the core chip where the corresponding bit of the non-used chip signals DEF is not activated, the transmission circuit 46c transmits the incremented layer address LID to the core chip of the lower layer. Accordingly, as shown in FIG. 7, when all of the bits of the non-used chip signals DEF are inactivated, the layer addresses of (0, 0, 0) to (1, 1, 1) are sequentially allocated to the core chips CC0 to CC7 from the uppermost layer to the lowermost layer.

Meanwhile, the transmission circuit 46c of the core chip where the corresponding bit of the non-used chip signals DEF is activated transmits, to the core chip of the lower layer, a non-incremented layer address LID, not an incremented layer address LID. Thereby, allocation of the layer address LID with respect to the non-used chip is skipped and the same layer address LID as that of the core chip of the lower layer is allocated to the non-used chip. That is, the layer address LID that is allocated to each of the core chips CC0 to CC7 is not a fixed address but a variable address that changes according to the non-used chip signals DEF. The same layer address LID as that of the core chip of the lower layer is allocated to the non-used chip. However, since activation of the control logic circuit 63 is prohibited in the non-used chip, a read operation or a write operation is not actually performed, even though an address signal or a command signal is input from the interface chip IF.

Naturally, the defective chip that is abnormally operated is selected as the non-used chip. However, some non-defective chips that are normally operated are also selected as the non-used chips, because of a reason in address control. Specifically, if the bit number of the layer address is changed to 2 bits, not 3 bits, and one of three layer address selection lines is not used, the layer addresses can be easily controlled. In this case, the semiconductor device 10 according to this embodiment can be provided as a partial product of 4 GB.

Figure 8:
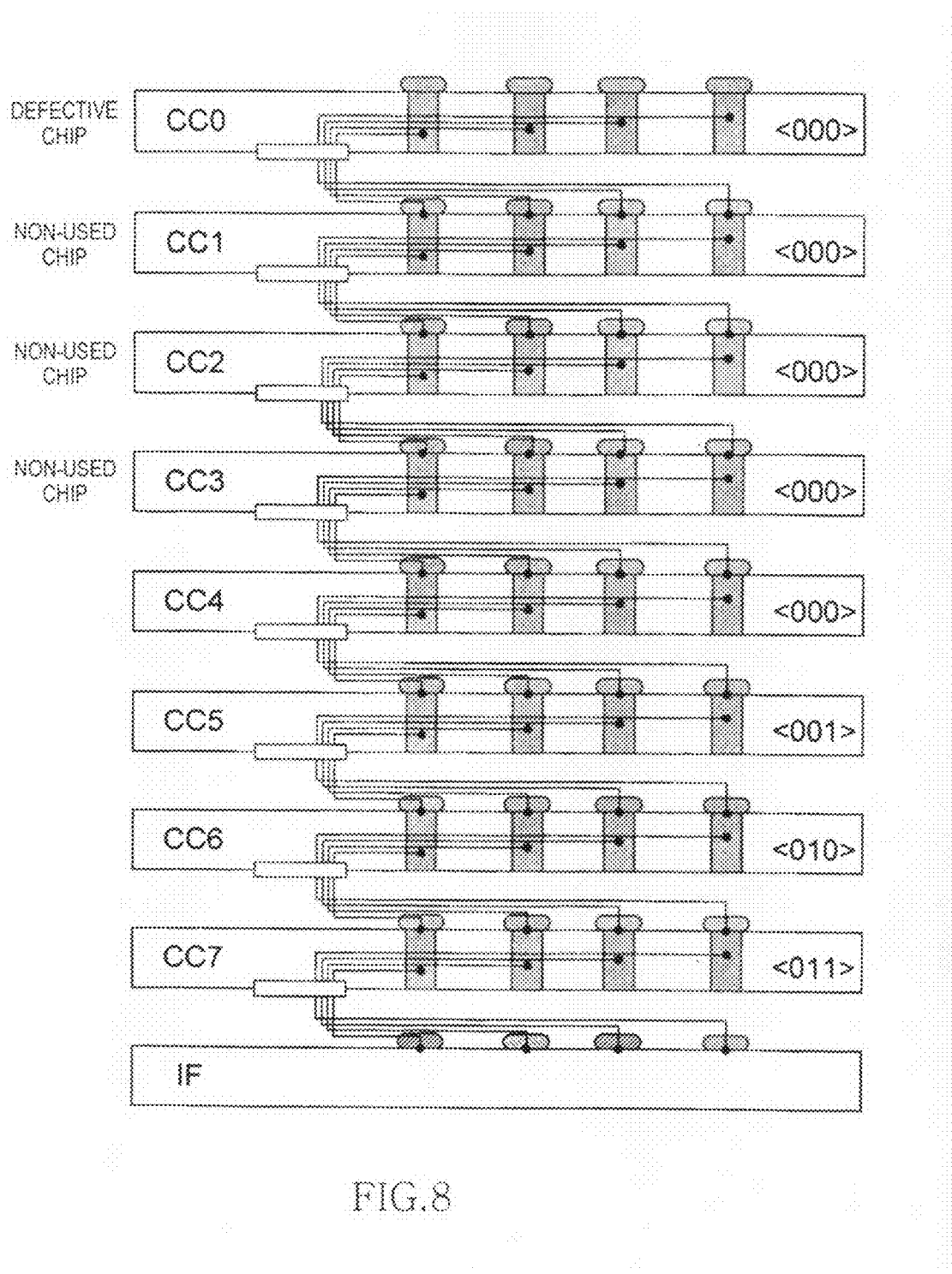
FIG. 8 is a schematic diagram showing one example of allocation of the layer address when some core chips are defective.

For example, when the core chip CC0 of the uppermost layer (first layer) is a defective chip and the core chip of the uppermost layer and the core chips CC1 to CC4 of the second to fourth layers are selected as the non-used chips, as shown in FIG. 8, all of the layer addresses LID of the core chips CC0 to CC4 of the first to fifth layers become (0, 0, 0), and the layer addresses of (0, 0, 1) to (0, 1, 1) are sequentially allocated to the core chips CC5 to CC7 of the sixth to eighth layers.

Figure 9:
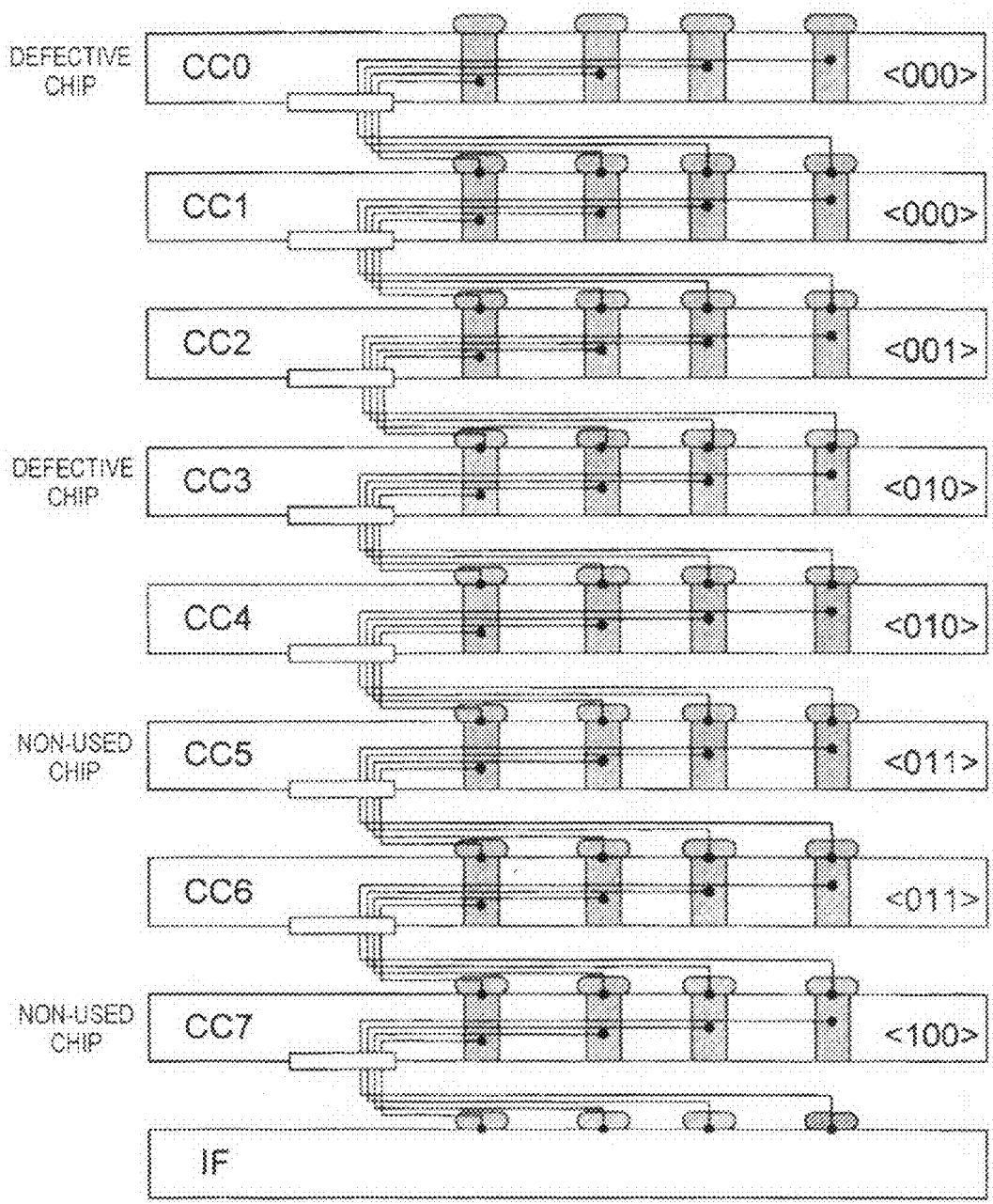
FIG. 9 is a schematic diagram showing another example of allocation of the layer address when some core chips are defective.

When the core chips CC0 and CC3 of the uppermost layer (first layer) and the fourth layer are defective chips and the core chips of the uppermost layer and the fourth layer and the core chips CC5 and CC7 of the sixth layer and the eighth layer are selected as the non-used chips, as shown in FIG. 9, the layer address LID of each of the core chips CC0 and CC1 of the uppermost layer and the second layer becomes (0, 0, 0), the layer address of the core chip CC2 of the third layer becomes (0, 0, 1), the layer address LID of each of the fourth layer and the fifth layer becomes (0, 1, 0), the layer address LID of each of the sixth layer and the seventh layer becomes (0, 1, 0), and the layer address LID of the eighth layer becomes (0, 1, 1).

A portion of the normal core chips that are selected as the non-used chips can be freely determined. However, some preferable determining methods are considered. One method is a method that selects the core chips as the non-used chips, sequentially from the core chip CC3 farthest from the interface chip IF, in consideration of saving efficiency of the TSV or resistance of the TSV. For example, when any one of the core chips CC0 to CC3 of the first to fourth layers is a defective chip, all of the core chips CC0 to CC3 of the first to fourth layers including the corresponding defective chip are selected as the non-used chips. When any one of the core chips of the fifth to eighth layers is a defective chip, the core chips CC0 to CC2 of the first to third layers including the corresponding defective chip are selected as the non-used chips. Another method is a method that inserts the non-used chips between the used chips to prevent the non-used chips from being continuously laminated. For example, when one of the core chips of the eight layers is a defective chip and the defective chip exists at the even-numbered layer, all of the core chips of the even-numbered layers are selected as the non-used chips and all of the core chips of the odd-numbered layers are selected as the used chips. In this way, since the distance between the activated chips increases, the chip temperature is suppressed from increasing. Alternatively, a combination of the two methods is also enabled.

The layer address LID that is set in the above way is supplied to the layer address comparing circuit (chip address comparing circuit) 47 in each of the core chips CC0 to CC7. The layer address comparing circuit 47 is a circuit that compares the layer address LID (chip identification number) supplied from the layer address generating circuit 46 and a portion (chip selection information) SEL of the address signal supplied from the interface chip IF through the TSV. Since the address signal is commonly supplied to the core chips CC0 to CC7 through the TSV1 of the type shown in FIG. 2A, the number of the core chips where matching is detected by the layer address comparing circuit 47 as a comparison result becomes only one.

Figure 10:
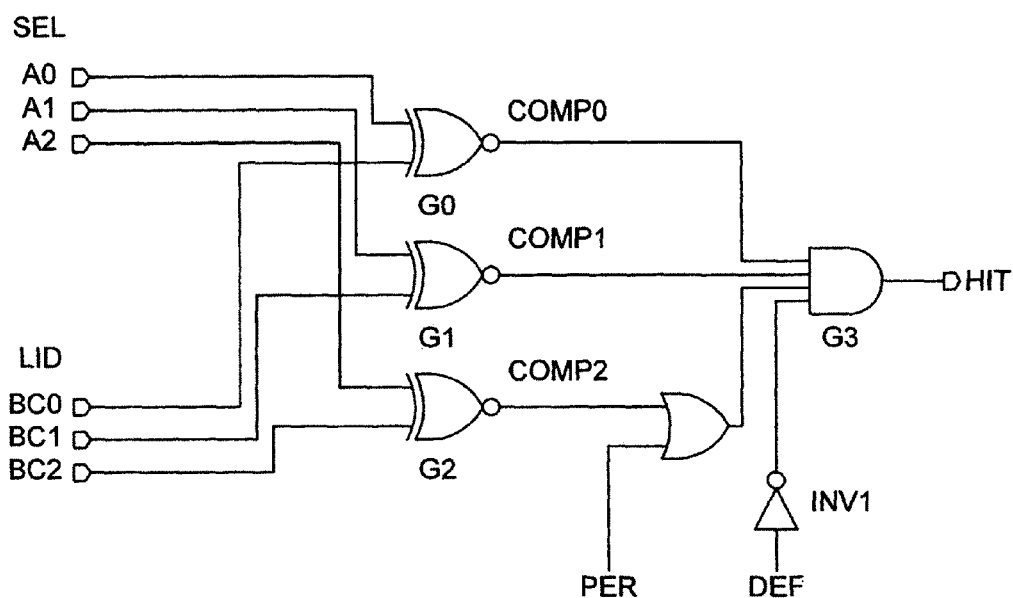
FIG. 10 is a circuit diagram showing the configuration of the layer address comparing circuit.

FIG. 10 is a circuit diagram showing the configuration of the layer address comparing circuit 47.

As shown in FIG. 10, individual bits (A2, A1, A0) of the chip selection information SEL and individual bits (BC2, BC1, BC0) of the layer address LID are supplied to the layer address comparing circuit 47. The layer address comparing circuit 47 has ENOR gate circuits G0 to G2 that compare corresponding bits of output signals and an AND gate circuit G3 that receives output signals COMP0 to COMP2 of the ENOR gate circuits G0 to G2, and an output of the AND gate circuit G3 is used as a matching signal HIT.

When the partial product that causes the four chips not to be used is configured, a partial signal PER that is commonly supplied to the core chips CC0 to CC7 is activated at a high level. The partial signal PER is input to an OR gate circuit (partial gate) G4 together with the output signal COMP2. Meanwhile, the output signal COMP2 of the ENOR gate circuit G2 that compares a most significant bit of the layer address is supplied to the AND gate circuit G3 via the OR gate circuit G4. When the partial signal PER is activated, an output of the OR gate circuit G4 is always maintained at a high level without depending on an output of the ENOR gate circuit G2. That is, the layer address comparing circuit 47 that receives the partial signal PER invalids the most significant bit and handles only the lower 2 bits as a comparison object of the layer address.

The non-used chip signal DEF is supplied from the non-used chip information holding circuit 33 to the layer address comparing circuit 47 of the core chip selected as the non-used chip. The non-used chip signal DEF is the same as that supplied to the layer address generating circuit 46 in the same core chip. The AND gate circuit G3 of the layer address comparing circuit 47 receives the non-used chip signal DEF together with the output signals COMP0 to COMP2. For this reason, even though the individual bits of the chip selection information SEL and the layer address LID are matched with each other, when the non-used chip signal DEF is activated at a high level, a level of a signal DEF that is supplied to the AND gate circuit G3 through an inverter INV1 becomes a low level. Therefore, the matching signal HIT is not output.

When all of the eight core chips are non-defective products, because all of the layer addresses are used, the non-used chip signals DEF and the partial signal PER are not supplied to all of the core chips CC0 to CC7. Accordingly, all of the layer address signal lines are activated and all bits of the layer address of 3 bits become a comparison object.

When one of the eight core chips is a defective chip, a most significant bit of the layer address is discarded to secure a ½ address space, and the so-called partial component is configured and used. In this case, the four core chips including the defective chip are selected as the non-used chips and the non-used chip signals DEF are supplied to the core chips. Since the remaining four core chips are commonly used, the non-used chip signals DEF are not supplied. In the case of the partial component, the partial signal is supplied to all of the core chips CC0 to CC7.

In the embodiment, the five or more defective chips are not assumed because of the following reason. Since the core chips are inspected once before an assembly, the probability of the five or more defective chips being generated after the assembly is extremely low. However, the present invention can be applied to even the case where the five or more defective chips exist. For example, when the five or six defective chips exist, two bits need to be discarded from the most significant bit of the layer address. For this reason, two partial gate circuits may be prepared and a ¼ address space (corresponding to the two core chips) may be secured. When the seven defective chips exist, all of three bits need to be discarded. For this reason, three partial gate circuits may be prepared and a ⅛ address space (corresponding to one core chip) may be secured.

As described above, in the semiconductor device 10 according to this embodiment, since the non-used chips are skipped in the allocation of the layer address LID, the controller recognizes that the non-used chip does not exist. For this reason, even when the defective chip is discovered after the assembly, only the normal partial core chips can be operated without requesting the controller to perform special control.

In this embodiment, when the defective chip is discovered after the assembly, the valid core chip number is set as power-of-two by invalidating the normal chips according to necessity. Therefore, the address space can be secured as power-of-two, and the layer address control can be easily performed by the controller. Specifically, when the defective chip number is 1 to 4, the valid core chip number may be set as 4, when the defective chip number is 5 and 6, the valid core chip number may be set as 2, and when the defective chip number is 7, the valid core chip number may be set as 1.

Figure 11:
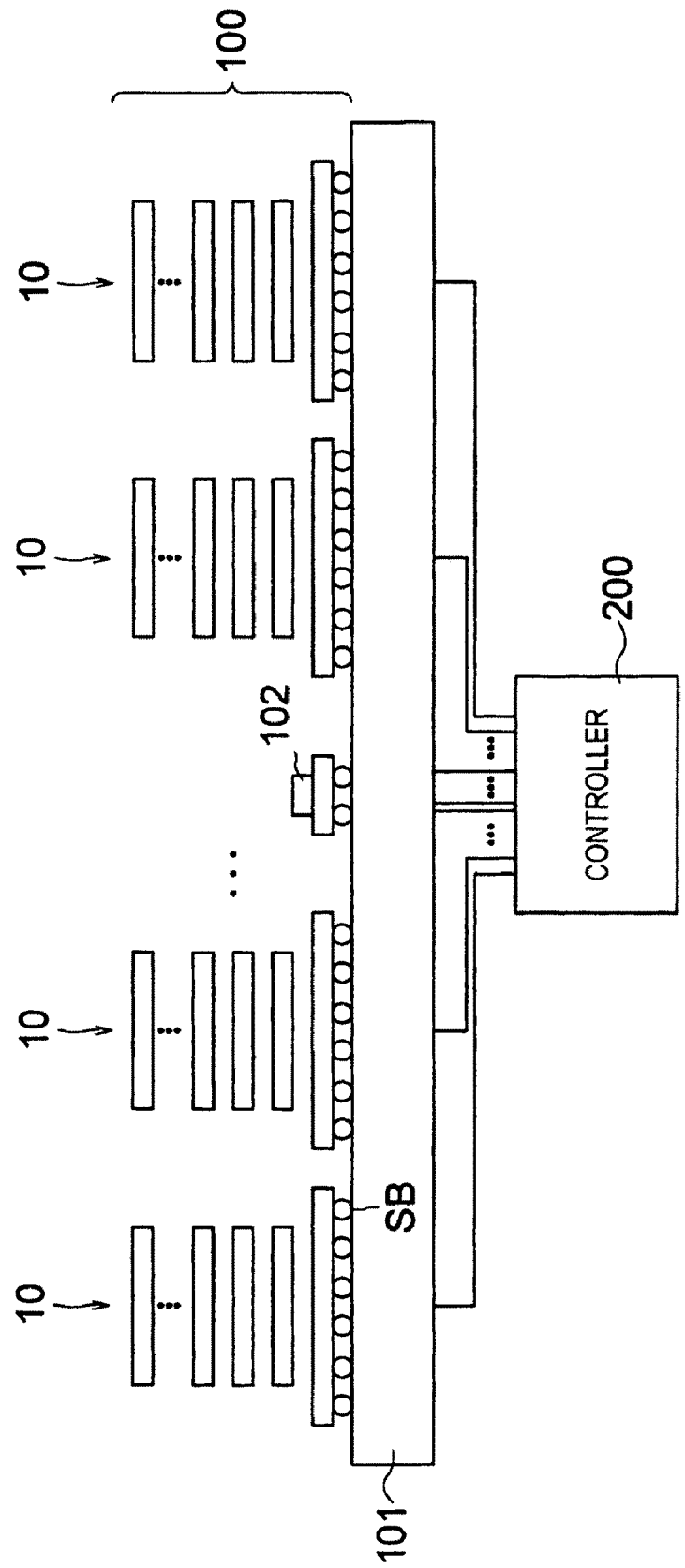
FIG. 11 is a diagram showing the configuration of a data processing system using the semiconductor device.

FIG. 11 is a diagram showing the configuration of a data processing system using the semiconductor device 10 according to this embodiment.

The data processing system shown in FIG. 11 includes a memory module 100 and a controller 200 connected to the memory module 100. In the memory module 100, the plural semiconductor devices 10 are mounted on a module substrate 101. A register 102 that receives an address signal or a command signal supplied from the controller 200 is mounted on the module substrate 101, and the address signal or the command signal is supplied to each semiconductor device 10 through the register 102. Further chip select information SEL is supplied from controller 200 to each semiconductor device 10.

In the data processing system that has the above configuration, the controller 200 may supply only various signals, such as the address signals or the command signals, which are needed for an access of a common DRAM, and does not need to supply a special signal, such as a chip selection address, which is not used in the common DRAM.

It is apparent that the present invention is not limited to the above embodiments, but may be modified and changed without departing from the scope and spirit of the invention.

For example, in the embodiment, the DDR3-type SDRAMs are used as the plural core chips having the same function. However, the present invention is not limited thereto. Accordingly, the core chip may be a DRAM other than the DDR3-type and a semiconductor memory (SRAM (Static Random Access Memory), PRAM (Phase-change Random Access Memory), MRAM (Magnetic Random Access Memory) or a flash memory) other than the DRAM. The core chips may be plural semiconductor chips that have functions other than the functions of the semiconductor memory, which are equal to or different from each other. That is, the core chips may be semiconductor devices, such as a CPU (Central Processing Unit), an MCU (Micro Control Unit), a DSP (Digital Signal Processor), an ASIC (Application Specific Integrated Circuit), and an ASSP (Application Specific Standard Circuit). All of the core chips do not need to be laminated and all or part of the core chips may be two-dimensionally disposed. The number of core chips is not restricted to 8.

In the embodiment, the case where the chip identification number of the uppermost layer is set as (0, 0, 0) and the chip identification numbers are incremented from the uppermost layer to the lower layers has been exemplified, but the present invention is not limited to this configuration. For example, the chip identification number of the lowermost layer may be set as (0, 0, 0) and the chip identification numbers may be incremented from the lowermost layer to the upper layers. The chip identification numbers are not incremented but may be decremented.

What is claimed is:
1. A semiconductor device comprising:
a plurality of core chips; and
an interface chip that supplies each of the plurality of core chips with an associated bit of non-used chip signals, wherein
each of the core chips includes a chip address generating circuit that receives a first chip address and generates a second chip address to identify the corresponding core chip based on received first chip address,
the chip address generating circuit supplies the first chip address that has different value of the received first chip address to another core chip when the non-used chip signal is in an inactivated state, and the chip address generating circuit supplies the first chip address that has same value of the received first chip address to another core chip when the non-used chip signal is in an activated state.

2. The semiconductor device as claimed in claim 1, wherein the chip address generating circuit supplies the first chip address that is incremented or decremented value of the received first chip address to another core chip when the non-used chip signal is in the inactivated state.

3. The semiconductor device as claimed in claim 1, wherein
each of the core chips further includes a chip address comparing circuit that compares a third chip address supplied from the interface chip and the second chip address,
the chip address comparing circuit activates a chip selection signal when the third chip address and the second chip address are matched with each other, and
the chip address comparing circuit inactivates the chip selection signal regardless of the third chip address when the non-used chip signal is in the activated state.

4. The semiconductor device as claimed in claim 3, wherein the chip address comparing circuit changes a bit number of the second chip address that is to be compared with the third chip address when a partial signal supplied from the interface chip is in activated state.

5. The semiconductor device as claimed in claim 4, wherein the chip address comparing circuit ignores most significant bits of the third chip address and the second chip address in comparing the third chip address and the second chip address when the partial signal is in the activated state.

6. The semiconductor device as claimed in claim 3, wherein the interface chip commonly supplies the third chip address to the plurality of core chips.

7. The semiconductor device as claimed in claim 3, wherein
each of the core chips further includes a memory cell array, and
the third chip address is included in address information to specify a memory cell included in the memory cell array.

8. The semiconductor device as claimed in claim 1, wherein the interface chip includes a non-used chip information holding circuit that holds the non-used chip signals.

9. The semiconductor device as claimed in claim 1, wherein the plurality of core chips are laminated.

10. The semiconductor device as claimed in claim 9, wherein
each of the core chips further includes a plurality of through silicon vias that penetrate a semiconductor substrate, and
the through silicon vias provided in the core chips adjacent in a lamination direction are short-circuited.

11. The semiconductor device as claimed in claim 9, wherein the plurality of core chips and the interface chip are laminated.

12. The semiconductor device as claimed in claim 9, wherein the chip address generating circuit supplies the first chip address to the core chip of the adjacent upper layer or lower layer.

13. The semiconductor device as claimed in claim 12, wherein the chip address generating circuit of the core chip of an uppermost layer or a lowermost layer is supplied with a fixed value generated in the corresponding core chip as the first chip address.

14. The semiconductor device as claimed in claim 1, wherein a bit number of internal unit data that is simultaneously input and output between the plurality of core chips and the interface chip is larger than the bit number of external unit data that is simultaneously input and output between outside and the interface chip.

15. The semiconductor device as claimed in claim 14, wherein the interface chip includes a data latch circuit that converts serial external unit data into parallel internal unit data and converts the parallel internal unit data into the serial external unit data.

16. An information processing system comprising:
a semiconductor device including a plurality of core chips and an interface chip that supplies each of the plurality of core chips with an associated bit of non-used chip signals; and
a controller that controls the semiconductor device, wherein
each of the core chips includes:
a chip address generating circuit that receives a first chip address and generates a second chip address to identify the corresponding core chip based on received first chip address; and
a chip address comparing circuit that compares a third chip address supplied from the interface chip and the second chip address, wherein
the chip address generating circuit supplies the first chip address that has different value of the received first chip address to another core chip when the non-used chip signal is in an inactivated state,
the chip address generating circuit supplies the first chip address that has same value of the received first chip address to another core chip when the non-used chip signal is in an activated state,
the chip address comparing circuit activates a chip selection signal when the third chip address and the second chip address are matched with each other,
the chip address comparing circuit inactivates the chip selection signal regardless of the third chip address when the non-used chip signal is in the activated state, and
the controller supplies the third chip address to the interface chip.

17. A semiconductor device comprising:
a plurality of first chips each including a chip address generating circuit that generates a chip address and a chip address comparing circuit that compare the chip address and a chip selection information; and
a second chip supplying the chip selection information to the first chips in common and supplying each bit of non-used chip signals to an associated one of the first chips, wherein
the chip address generating circuits generate the chip addresses having different value from one another when corresponding bits of the non-used chip signals are in an inactive state, and
the chip address comparing circuits are inactivated when corresponding bits of non-used chip signals are in an active state.

18. The semiconductor device as claimed in claim 17, wherein each of the chip address generating circuits generates the chip address having same value as another first chip when corresponding bit of the non-used chip signals is in the active state.

19. The semiconductor device as claimed in claim 17, wherein
the first chips and the second chip are laminated,
each of the first chips further includes first through silicon vias and second through silicon vias that penetrate a semiconductor substrate, the chip selection information are supplied via the first through silicon vias, and the non-used chip signals are supplied via the second through silicon vias.

20. The semiconductor device as claimed in claim 19, wherein the first through silicon vias provided in different first chips and vertically aligned are short-circuited, and the second through silicon vias provided in different first chips and vertically aligned are not short-circuited.

* * * * *